(12) United States Patent
Laur et al.

(10) Patent No.: US 8,570,014 B2
(45) Date of Patent: Oct. 29, 2013

(54) ADVANCED CLOCK SYNCHRONIZATION CIRCUIT FOR SWITCH MODE POWER SUPPLIES

(75) Inventors: Steven Patrick Laur, Raleigh, NC (US); Zbigniew Jan Lata, Plano, TX (US); Jinyu Yang, Plano, TX (US)

(73) Assignee: Intersil Americas, LLC, Milpitas, CA (US)

( * ) Notice: Subject to any disclaimer, the term of this patent is extended or adjusted under 35 U.S.C. 154(b) by 287 days.

(21) Appl. No.: 13/198,179

(22) Filed: Aug. 4, 2011

(65) Prior Publication Data
US 2012/0274146 A1 Nov. 1, 2012

Related U.S. Application Data

(60) Provisional application No. 61/481,229, filed on May 1, 2011.

(51) Int. Cl.
- G05F 1/00 (2006.01)
- G05F 3/02 (2006.01)
- G06F 1/08 (2006.01)
- H03K 3/00 (2006.01)
- H02M 1/10 (2006.01)

(52) U.S. Cl.
USPC ............. 323/283; 327/99; 327/298; 327/538; 327/547

(58) Field of Classification Search
USPC .............................................. 323/283; 327/99
See application file for complete search history.

(56) References Cited

U.S. PATENT DOCUMENTS

| | | | |
|---|---|---|---|
| 6,728,891 B2 * | 4/2004 | Hanjani | 713/300 |
| 6,891,409 B2 * | 5/2005 | Furuya | 327/141 |
| 6,912,139 B2 * | 6/2005 | Kernahan et al. | 363/41 |
| 6,937,485 B2 * | 8/2005 | Suzuki et al. | 363/41 |
| 7,287,177 B2 * | 10/2007 | Bonaccio et al. | 713/502 |
| 7,535,210 B2 * | 5/2009 | Wang | 323/282 |
| 7,567,633 B2 * | 7/2009 | Durand et al. | 375/340 |
| 7,759,990 B2 * | 7/2010 | Miike | 327/147 |
| 2010/0001767 A1 * | 1/2010 | Shikata | 327/99 |

* cited by examiner

Primary Examiner — Adolf Berhane
Assistant Examiner — Emily P Pham
(74) Attorney, Agent, or Firm — Donald L. Bartels; Bartels Law Group (57) ABSTRACT

In a switch mode power supply, a circuit and method for switching between an internal clock and an external synchronization clock when a stable external clock has been detected, and for switching back to operating the power supply using said internal clock when a predetermined number of sequential external clock pulses exceed a predetermined switching period dropout threshold or are otherwise missing. In one embodiment, a power system comprises a plurality of power supplies connected in parallel to a common load and where each power supply is synchronized to the external clock when a stable external clock has been detected by each.

18 Claims, 10 Drawing Sheets

ADVANCED CLOCK SYNCHRONIZATION CIRCUIT FOR SWITCH MODE POWER SUPPLIES

CROSS-REFERENCE TO RELATED APPLICATIONS

This application claims the benefit of U.S. Provisional Application Ser. No. 61/481,229, filed on May 1, 2011, which is hereby incorporated by reference in its entirety.

BRIEF DESCRIPTION OF THE DRAWINGS

The features, advantages, and benefits of the present invention will become more apparent from the following description taken in conjunction with the accompanying drawings, which are presented solely for exemplary purposes and not with the intent to limit the invention thereto, and in which.

DETAILED DESCRIPTION

A system containing multiple switch mode power supplies (SMPS) sometimes require synchronization to a common external clock to improve the EMI and power conversion efficiency of the system. This synchronization can be achieved in several ways. The clock synchronization circuit according to various embodiments of the present invention enables a given power supply to switch from the power supply's internal clock to the common external clock when a stable external clock has been detected. Once the external clock is controlling the power supply, the synchronization circuit actively monitors the switching period of the external clock and references any dropout condition with respect to itself. That is, the synchronization circuit compares the switching period of each external clock pulse to the switching period of the adjacent previous external clock pulse, if available. Because of this, in one embodiment, even if only a 10% slip in the external clock's switching period is experienced, the clock pulse is considered "missing" and is quickly replaced by a replacement clock pulse generated by a "watch dog" circuit. After a predetermined number of replaced pulses are generated in series, a counter causes the operation of the power supply to be switched back to the internal oscillator clock for operation of the power supply. Since the transition edges of both the replacement clock pulses and the internal clock pulses are typically very near to where the external clock transition edge would have occurred, the output voltage generated by the power supply experiences very little disturbance.

When transitioning from the internal to the external clock, the synchronization circuit according to one embodiment of the present invention waits until both the internal and external clock pulses are very near to each other before making the switch to the external clock. This also ensures minimal disturbance in the output voltage.

Figure 1:
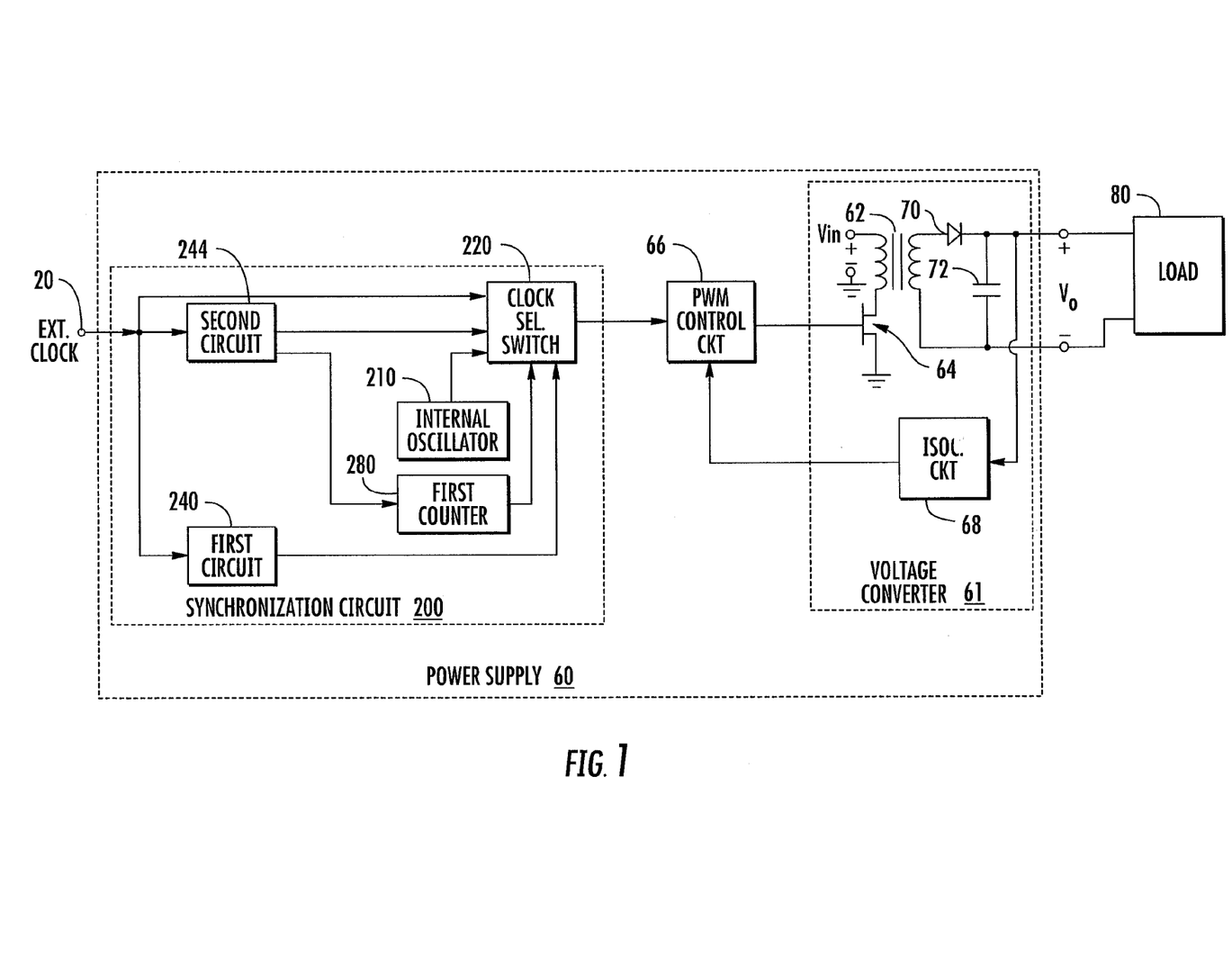
FIG. 1 is a block diagram of an embodiment of a switch mode power supply including an embodiment of a synchronization circuit according to the present invention.

FIG. 1 is a block diagram of an embodiment of a switch mode power supply 60 including an embodiment of a synchronization circuit 200 according to the present invention. As seen in FIG. 1, exemplary power supply 60 includes a pulse width modulation (PWM) control circuit 66 whose input clock is the PWM clock output by synchronization circuit 200. PWM control circuit 66 controls the operation of a voltage converter 61 which, in one embodiment, converts an input voltage Vin into a regulated output voltage Vo for coupling to a load 80. Load 80 can be any device that uses power, including a computer laptop, a server, an integrated circuit (IC) chip set, an analog circuit, a telecommunication system, etc., as is well known in the art. The topology for voltage converter 61 can be a buck regulator, a boost regulator, a buck-boost regulator or any other power converter topology, as is also well known in the art. The exemplary converter 61 shown in FIG. 1 is a flyback power converter.

In the exemplary converter 61 shown in FIG. 1, Vin is converted to Vo by means of a transformer 62 whose primary winding current is a function of the state of a MOSFET switch 64 which is controlled by PWM control circuit 66. When the MOSFET switch 64 is closed, energy is stored in the primary winding of transformer 62. This energy is transferred to the secondary winding and thereby to an output capacitor 72 through a rectifying diode 70 when the MOSFET switch 64 is opened. The width of the pulse generated by PWM control circuit 66 (i.e., its duty cycle) is adjusted by the PWM 66 to regulate the output voltage Vo, which is fed back to PWM control circuit 66 via an isolating circuit 68.

The clock in power supply 60 that controls the clock frequency of the PWM control circuit 66 is generated by synchronization circuit 200. As seen in FIG. 1, synchronization circuit 200 includes a clock selector switch 220 whose output clock is fed to PWM control circuit 66. The clock pulse output by clock selector switch 220 switches between the external clock, the internal clock, and a replacement clock for operation of power supply 60. Clock selector switch 220 enables the internal clock to operate power supply 60 when an internal clock select signal is caused to be generated by a first counter 280 and enables the external clock to operate power supply 60 when an external clock select signal is caused to be generated by first circuit 240 at all times except when a replacement clock pulse is generated by a second circuit 244. When a replacement clock pulse is generated, clock selector switch 220 causes this clock pulse to operate power supply 60. First circuit 240 detects when a stable external clock exists and causes the external clock select signal to be generated in response to this detection. Second circuit 244 detects when the external clock has a pulse period that is longer than the period of the previous external clock pulse by a predetermined dropout threshold. In response, second circuit 244 generates a replacement clock pulse that is coupled to clock selector switch 220. First counter 280 counts the number of replacement clock pulses generated sequentially by second circuit 244 and causes the internal clock select signal to be generated when a predetermined count has been reached. First counter 280 is reset by any external clock pulse whenever the period of the external clock pulse does not result in the generation of a replacement clock pulse by second circuit 244.

Figure 1A:
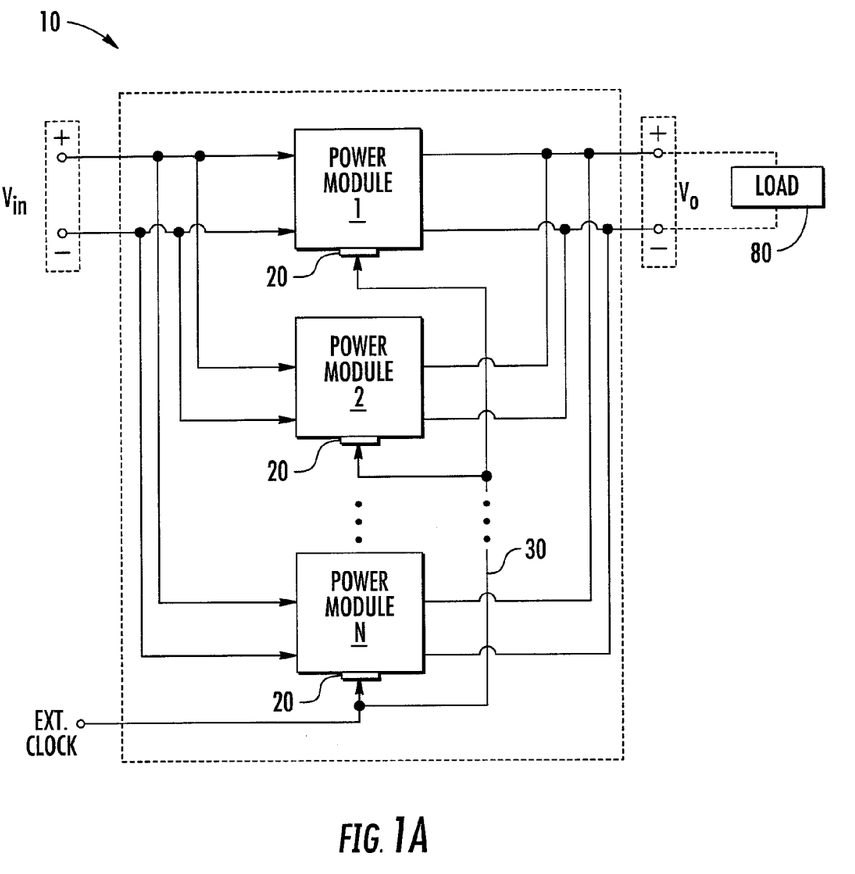
FIG. 1A is a block diagram of an embodiment of a system including a plurality of power supplies as shown in FIG. 1.

Although the embodiment of the present invention shown in FIG. 1 shows only one power supply 60, the system of the present invention may include a plurality of power supply 60 modules where each is synchronized to a common external clock. FIG. 1A is a block diagram of an embodiment of a system 10 of a plurality of power supply 60 modules 1-N (also referred to herein as "power modules") where the power supply 60 modules are connected in parallel for supplying power to a common output voltage bus for supplying voltage Vo to a load 80. As shown in FIG. 1A, power modules 1, 2, . . . N are each coupled to a single power output port for supplying power to load 80. In one embodiment, power is supplied to power modules 1 through N at a single power input port where the input voltage Vin is coupled. It will be recognized by those skilled in the art that it is not necessary according to the present invention that power be supplied to power modules 1 through N at a single power input port. Rather, each power module may receive power from a separate power source such as separate AC-DC converters (not shown).

Each power module in system 10 has an external clock terminal 20 and, as shown in FIG. 1A, terminals 20 of power modules 1 through N are all coupled to each other via a bus 30. As described above with regard to FIG. 1, when an external clock is fed to each power module in system 10, each power module acts under the control of its respective synchronization circuit 200 to cause that power module to operate with its PWM clock synchronized to the other power modules.

Figure 2:
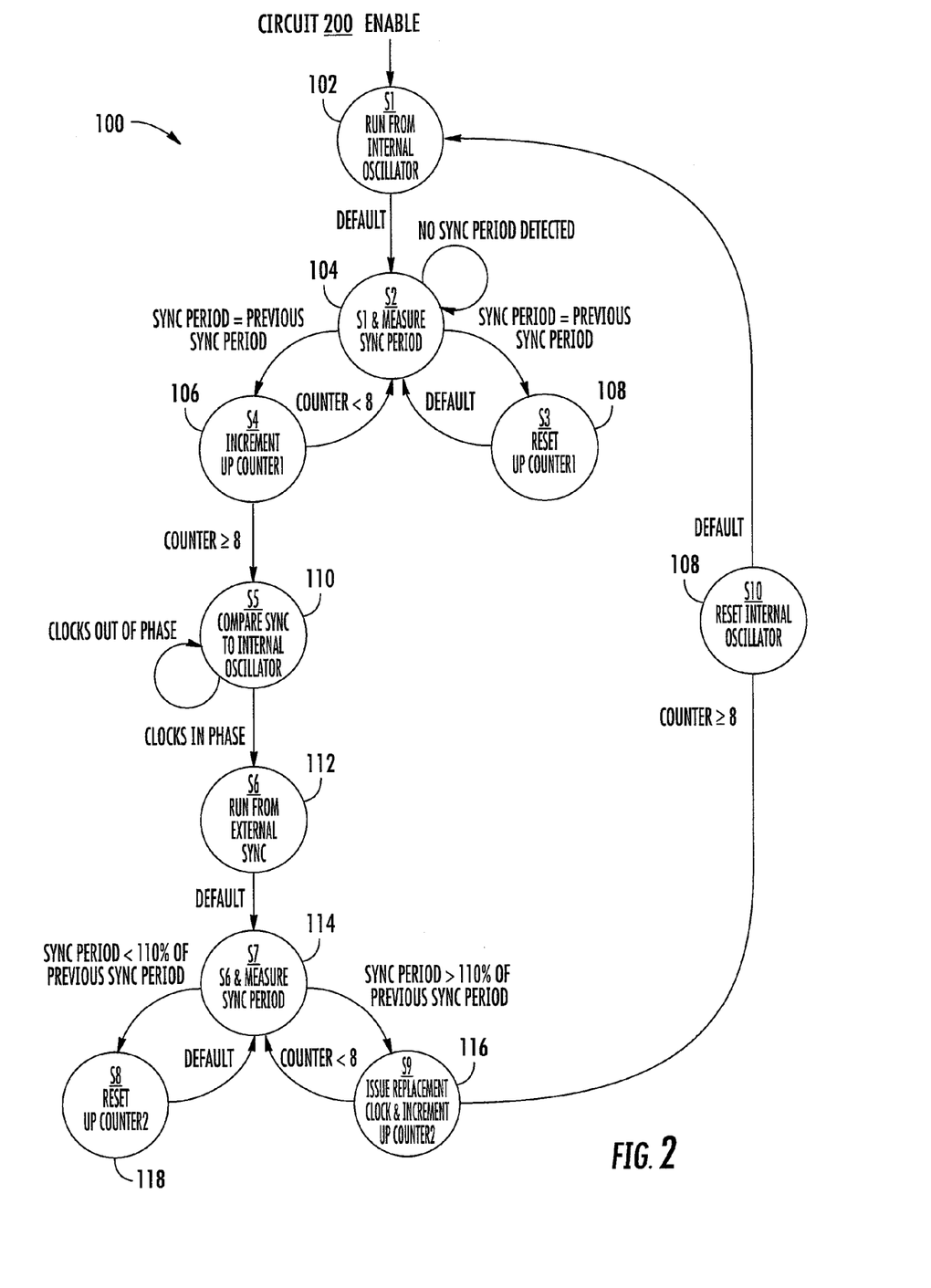
FIG. 2 is a state diagram that illustrates an embodiment of a control system according to the present invention for switching back and forth between an internal clock and an external synchronization clock.

FIG. 2 is a state diagram 100 that illustrates the operation of an embodiment of a synchronization circuit 200 according to the present invention for switching back and forth in a controlled way between an internal clock and an external synchronization clock (labeled "SYNC" in FIG. 2). As seen in FIG. 2, when the clock synchronization circuit 200 is first enabled, e.g., when power is first applied to the switch mode power supply 60 containing circuit 200, the state diagram 100 is in a first state 102 where the power supply is being run from the circuit 200 internal clock oscillator 210. At state 104, first circuit 240, a stable clock select circuit, measures the switching period of the current external synchronization (SYNC) clock pulse. In one embodiment, if the switching period of the current external clock pulse is substantially equal to the switching period of the previous external clock pulse, a first counter is incremented at state 106. If the switching period of the current external clock pulse is not substantially equal to the switching period of the previous external clock pulse, the counter is reset, as seen at state 108. Once states 104 and 106 have determined that a predetermined plurality of external clock pulses of substantially equal switching period have been sequentially detected, the state diagram 100 indicates that circuit 200 moves to state 110. An exemplary count of 8 in the first counter may be used to cause the state diagram 100 to transition to state 112.

In one embodiment, the state diagram 100 includes state 110 between state 106 and 112. In state 110, circuit 200 optionally detects when the rising edges of the internal and external clocks occur within a predetermined duration of time of each other, i.e., when the two clocks are close to being in phase. This duration of time should be selected so as to minimize the time before the synchronization circuit causes power supply operation to switch over to the external clock, while avoiding more than a minimum acceptable level of output voltage disturbance. That is, the pulse transitions of the internal and external clocks should be close enough to enable a relatively clean switch over from the internal clock to the external clock.

As described below, once circuit 200 determines that the external clock is stable, an external clock select signal is caused to be generated. In one embodiment, this signal is generated by a latch that is set, to cause power supply 60 operation to be switched over to the external clock. State 112 of state diagram 100 indicates when power supply 60 is being run from the external clock. Power supply 60 remains in this state so long as the external clock remains stable.

Circuit 200 then begins to monitor the external clock, as seen at state 114, via a second circuit 244. In state 114, second circuit 244 determines if the switching period of the external clock exceeds a predetermined dropout threshold. In one embodiment, as indicated in FIG. 2, the dropout threshold is set at 10% of the expected switching period of the external clock. In state 114, each external clock switching period is measured to determine if it is 110% longer in duration or more as compared to the previous external clock pulse. If it is, then a second counter is incremented at state 116 and a replacement clock is generated and used by the power supply 60 in place of the external clock. As is seen, a replacement clock pulse is generated whenever the external clock's switching period exceeds the dropout threshold. Whenever the next external clock switching period is less than this 110% duration, the second counter is reset to zero, as indicated at state 118. If the external clock remains missing, second circuit 244 will continue to generate the replacement clock at a predetermined frequency. In one embodiment, if the second counter reaches a predetermined count, e.g., a count of 8, an internal clock select signal is generated to cause the operation of the power supply to be switched back to operation using the internal clock, at stage 102. Note that the internal oscillator used to generate the internal clock may optionally be reset at stage 118 in one embodiment by the internal clock select signal in order to synchronize the internal clock to the replacement clock.

Figure 3:
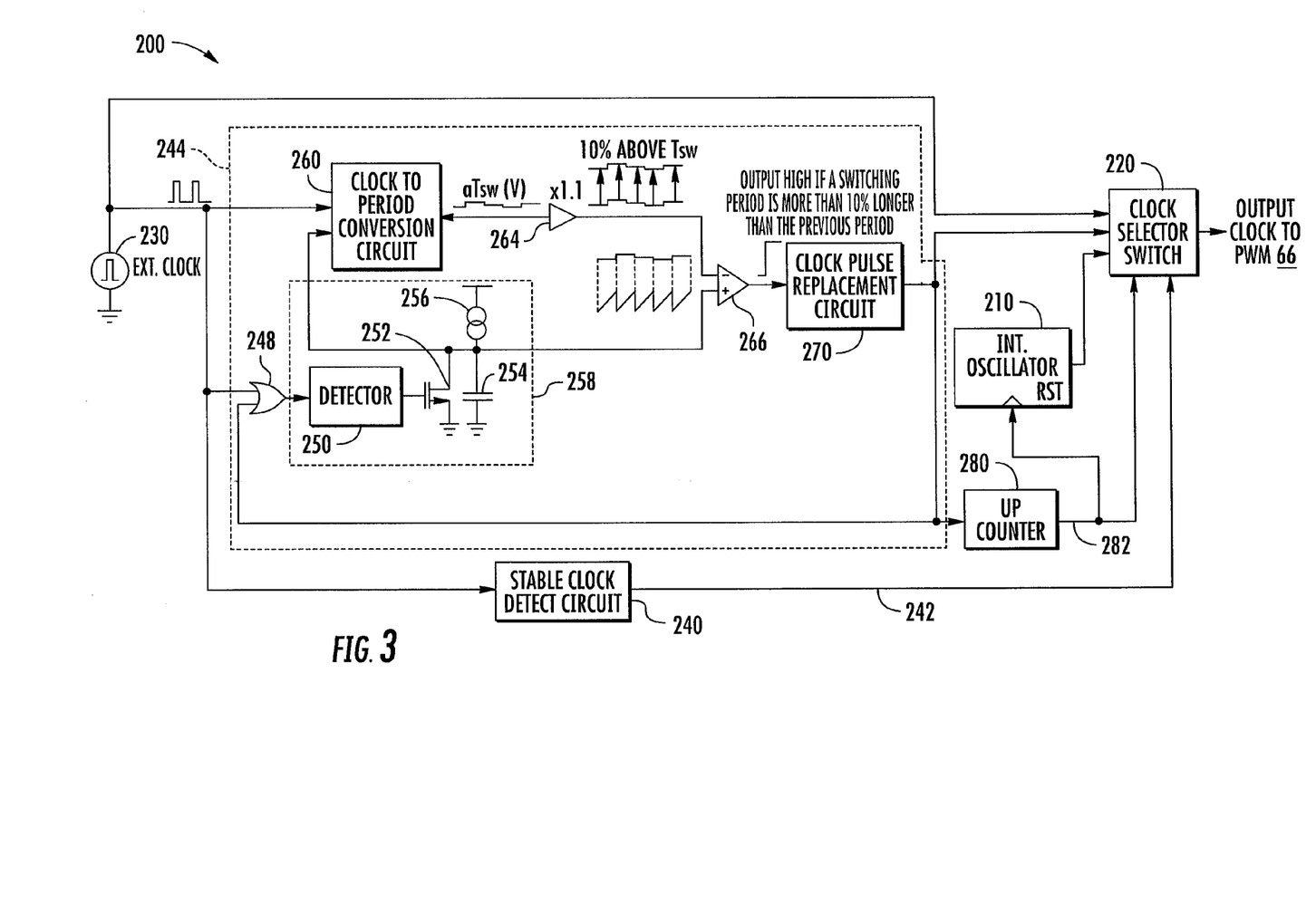
FIG. 3 is a block diagram of an embodiment of a synchronization circuit according to the present invention.

FIG. 3 is a block diagram of an embodiment of a synchronization circuit 200 according to the present invention. This synchronization circuit 200 is typically implemented in integrated circuit (IC) form, but one of ordinary skill would be able to implement the functions in analog form or with a combination of digital and analog components. Synchronization circuit 200 includes an internal oscillator 210 for generating an internal clock. Internal oscillator 210 couples the internal clock to a clock selector switch 220, which functions to switch between an external clock 230, the internal clock, and the replacement clock, as described below, for operation of said power supply. Clock selector switch 220 enables the internal clock to operate the power supply when an internal clock select signal is generated on signal line 282, and enables the external clock to operate the power supply when an external clock select signal is generated on signal line 242 at all times except when the replacement clock pulse is generated.

As is seen in FIG. 3, the output of clock selector switch 220 is used in the illustrated embodiment as the pulse width modulation (PWM) clock pulse used by the power supply.

FIG. 3 shows that the external clock is monitored by several circuits inside synchronization circuit 200. Assuming the power supply is not already synchronized, i.e., it is running from the circuit's internal clock, when an external synchronization clock is applied, it is coupled to a stable clock detect circuit 240 in circuit 200. This first circuit 240 detects when a stable external clock exists and causes in response the generation of an external clock select signal 242 that is coupled to clock selector switch 220. Stable clock detect circuit 240 determines when a predetermined plurality of external clock pulses of substantially equal switching period has been sequentially detected. This corresponds to states 104, 106, and 108 in FIG. 2. A description of an exemplary stable clock detect circuit 240 is described below and shown in FIG. 6.

When circuit 200 is in the mode where the clock output to the power supply is the synchronizing external clock, a second circuit 244 in circuit 200 monitors the external clock to detect whether any external clock pulses drop out. If so, second circuit 244 acts to maintain tight output voltage regulation by generating one or more replacement clock pulses. Second circuit 244 includes a saw-tooth wave generator circuit 258, a clock to period conversion circuit 260, a multiplier 264 and a comparator 266. Saw-tooth wave generator circuit 258 includes an edge detector 250. The external clock is edge detected by edge detector 250 via an OR gate 248. The output of edge detector 250 feeds the gate of a MOSFET 252 which acts to reset a capacitor 254 fed by a current source 256. The net effect is that the voltage across capacitor 254 is a saw-tooth wave that ramps to a voltage each switching cycle that is proportional to the switching period, Tsw, of the external clock. The peak of this saw-tooth wave is sampled and held by clock to period conversion circuit 260. Circuit 260 outputs a signal that is a cycle-by-cycle DC voltage representation of switching period Tsw. In the example shown in FIG. 3, this clock to period conversion signal is a DC value that is held until the peak of the next external clock pulse is sampled. This signal is multiplied by 1.1, or increased by 10%, by multiplier 264 to set a dropout threshold for the external clock. The saw-tooth ramp generated by circuit 258 is compared against this dropout threshold by a comparator 266 to determine if the external clock is out of bounds. Essentially, the above described circuits operate such that, if a subsequent Tsw is more than 110% of the previous Tsw, second circuit 244 signals an external clock dropout condition.

Once this dropout condition is met, second circuit 244 quickly causes a replacement clock pulse to be generated by a clock pulse replacement circuit 270 and an out of bounds up counter 280 is incremented. Second circuit 244 does this by coupling the output of comparator 266 to clock pulse replacement circuit 270. When the output of comparator 266 goes high, circuit 270 generates the replacement clock pulse. This replacement clock pulse is coupled to counter 280 and to clock selector switch 220 for output to the power supply in place of the external clock pulse. As indicated above with respect to FIG. 2, a replacement clock pulse is generated whenever the external clock's switching period exceeds the dropout threshold or is missing.

If the external clock is missing for one or more cyles, the above-described saw-tooth ramp is triggered by the replacement clock pulse instead of the external clock pulse since it is also fed to edge detector 250 via OR gate 248.

Circuit 270 continues to generate replacement clock pulses in place of missing or out of bounds external clock pulses in the above described manner until a predetermined count is achieved (4 or 8 typically) in up counter 280. Once this counter limit is reached, counter 280 causes the internal clock select signal 282 to be generated. In one embodiment, this signal is coupled to the clock selector switch 220 to cause a latch contained in that circuit to reset and thereby cause the circuit 220 to again output the internal clock to the power supply. Alternatively, the output of counter 280 continues to generate the internal clock select signal until reset by the generation of the next external clock select signal. In one embodiment, the internal oscillator 210 is also reset at the same time that the internal clock select signal 282 is generated, to enable it to resume operation in sync with the clock replacement pulse.

The above described circuit operation of synchronization circuit 200 ensures that, if there is a momentary lapse in the receipt of external clocks (for various reasons), the power supply will "ride through" the event by generating replacement clocks. Similarly, if a predetermined sequential number of replacement clocks are generated, circuit 200 creates a smooth transition back to the internal clock.

Figure 4:
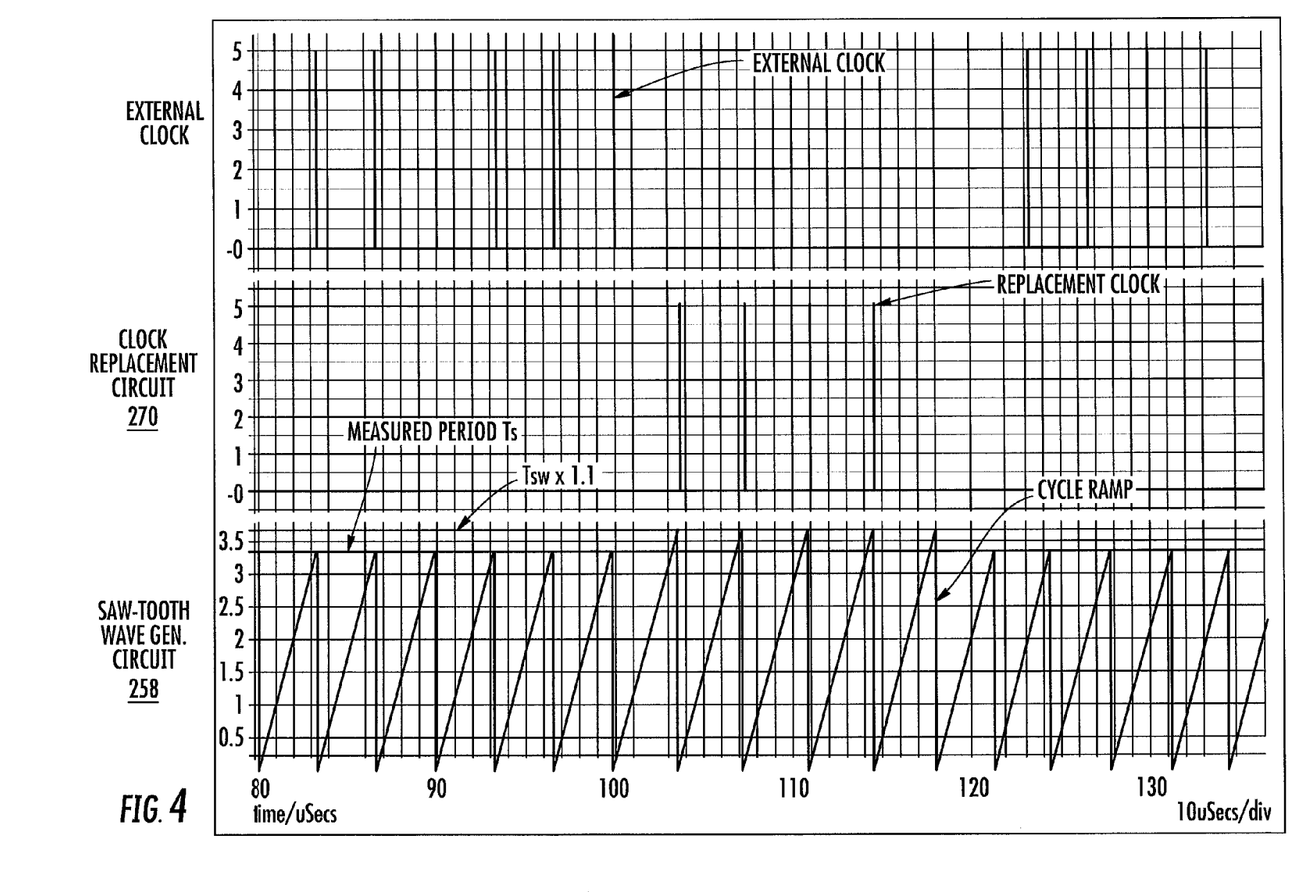
FIG. 4 is a timing diagram that illustrates the generation of replacement clock pulses by the synchronization circuit of FIG. 3 when the external clock drops out.

FIG. 4 is a timing diagram that illustrates the generation of replacement clock pulses by the clock pulse replacement circuit 270 in synchronization circuit 200 of FIG. 3. As can be seen, when the external clock drops out, the saw-tooth wave generated by saw-tooth wave generator circuit 258 ramps up past the time that represents the pulse width of the previous external clock pulse (see the ramp generated starting at time 100), which causes the ramp to reach the level corresponding to Tsw times 1.1. Comparator 266 detects this level and outputs a pulse which causes replacement circuit 270 to generate a first replacement clock pulse. Since the external clock remains missing for several more clock pulse intervals, second circuit 244 continues to generate replacement clock pulses. As is seen, four such replacement clock pulses are generated sequentially in this example. As a result, counter 280 will have counted four counts and caused the generation of the internal clock select signal 282

Figure 5:
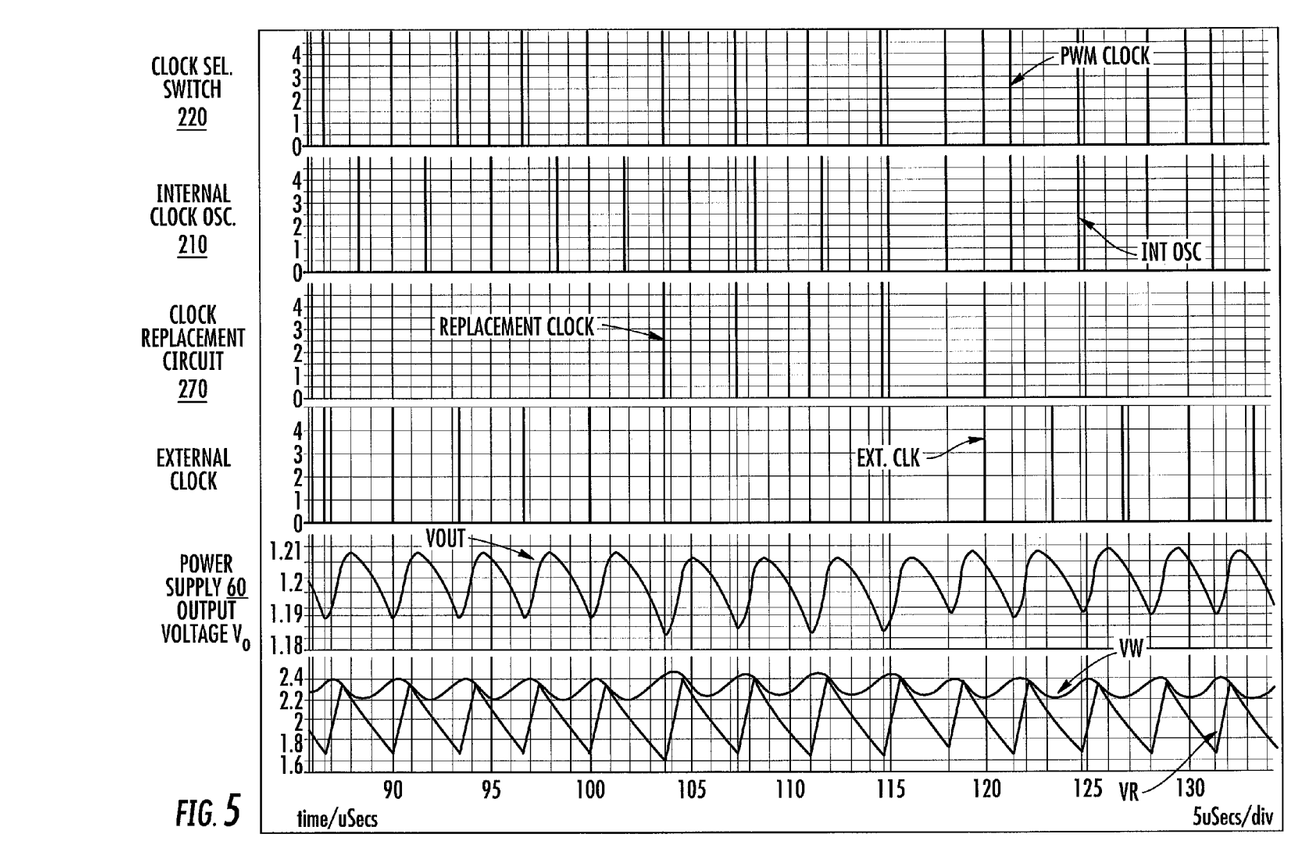
FIG. 5 is a timing diagram that illustrates how the output voltage may vary when the replacement clock pulses drive the converter.

FIG. 5 is a timing diagram that illustrates the effect of the synchronization circuit outputting to a PWM clock that first comprises the external clock, then comprises the replacement clock, and lastly comprises the internal clock once the four replacement clock pulses have been generated. FIG. 5 also shows how the output voltage Vo during these clock transitions. FIG. 5 first shows the external clock generating the PWM clock pulse output by clock select switch 220 from a time before 90 μsec. up to 100 μsec. During a dropout event that starts at time 100, clock select switch 220 outputs as the PWM clock pulse the pulse generated by the clock replacement circuit 270. As indicated above, when the external clock drops out at 110%*Tsw, the clock pulse replacement circuit 270 quickly issues one or more replacement clock pulses. Some delay in the generation of the PWM clock results as seen in the increased gap between the fifth and sixth PWM clock pulse shown, between time 100 and about time 104. In one embodiment, once four consecutive replacement pulses are generated, circuit 200 switches back to outputting the internal clock as the PWM clock. As seen in FIG. 5, the pulses output as the PWM clock at this point correspond to the pulses generated by the internal clock oscillator 210. Power supply 60 output voltage deviation results from each of these uneven transitions but the amount of this deviation is thus kept to a minimum.

Figure 6:
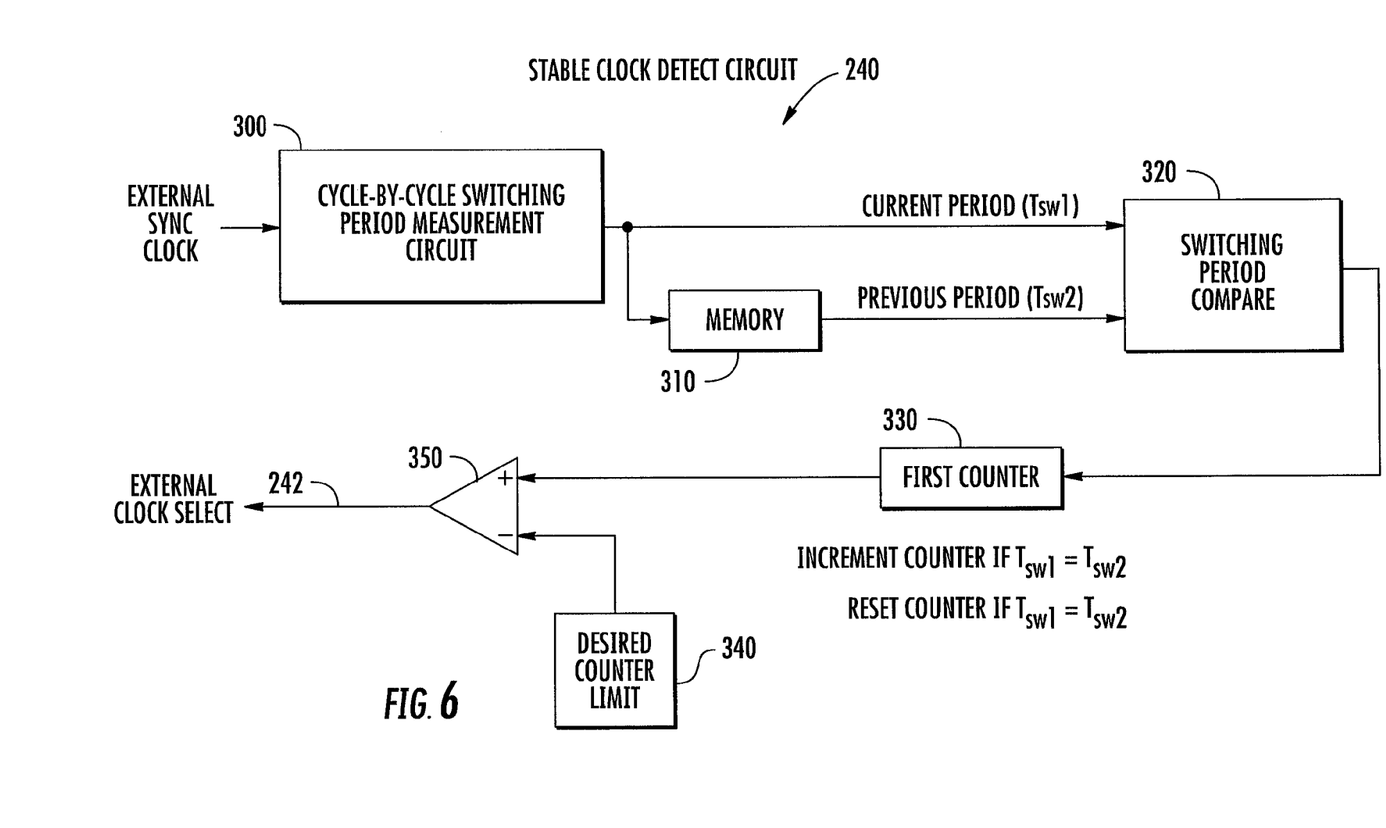
FIG. 6 is a block diagram of a stable external clock detect circuit.

FIG. 6 is a block diagram of one embodiment of a stable external clock detect circuit 240 according to the present invention. As indicated above, the stable clock detect circuit 240 determines when a predetermined plurality of external clock pulses of substantially equal switching period have been sequentially detected. As seen in FIG. 6, the external SYNC clock is fed to a cycle-by-cycle switching period measurement circuit 300. Circuit 300 measures the switching period of each external clock pulse. The output of circuit 300 is fed to a memory 310 for storing the measured switching period for one external clock period. Switching period compare circuit 320 compares the switching period of the current external clock pulse to the stored switching period in memory 310 and generates a match signal when the two switching periods are substantially equal. The output of compare circuit 320 is fed to an incrementing first counter 330. Counter 330 is incremented each time a match signal is generated by compare circuit 320. Counter 330 is reset whenever the two switching periods are not substantially equal. The external clock select signal 242 is generated in response to first counter 330 reaching a predetermined count, e.g., 8, as determined by a desired counter limit circuit 340 and gate 350.

Figure 7:
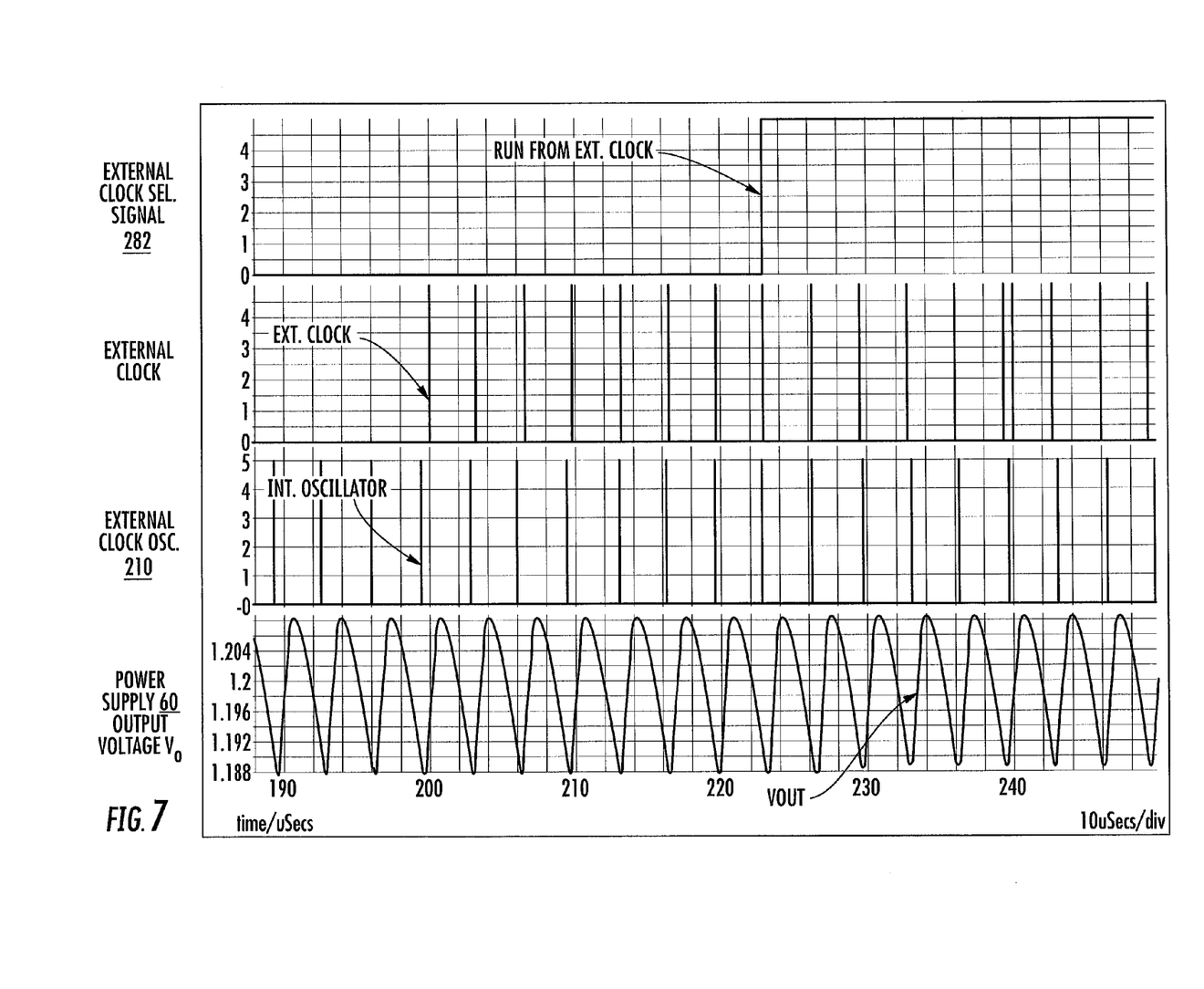
FIG. 7 is a timing diagram that illustrates the switchover from the internal oscillator to the external clock after a series of stable external clocks are detected by the synchronization circuit.

FIG. 7 is a timing diagram that illustrates the switchover from the internal oscillator to the external clock after a series of stable external clocks are detected by the stable clock detect circuit 240 in synchronization circuit 200. As is seen, in one embodiment, after eight substantially equal external clock pulses are detected by the stable clock select circuit 240, circuit 240 causes the external clock select signal 282 to be generated. This causes the clock selector switch to switch over and begin outputting as the PWM clock the external clock pulses instead of the internal clock pulses. FIG. 7 also provides an example of how this switchover would only minimally impact the output voltage Vo of power supply 60.

Figure 8A:
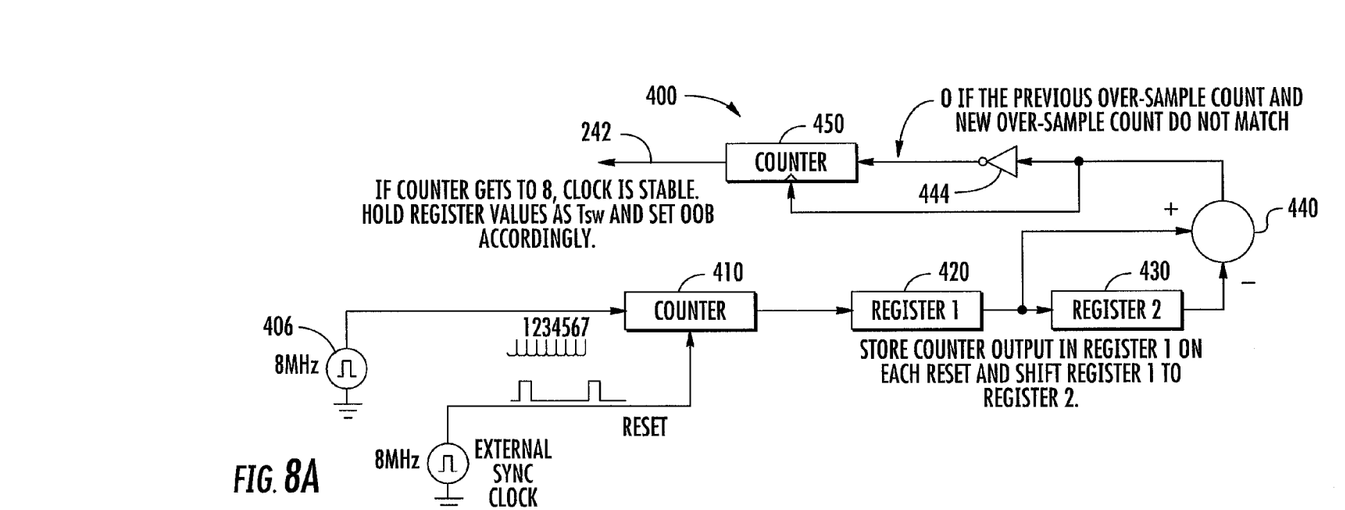
FIG. 8A is an alternate circuit for detecting when a predetermined series of stable external clock pulses have been detected.
Figure 8B:
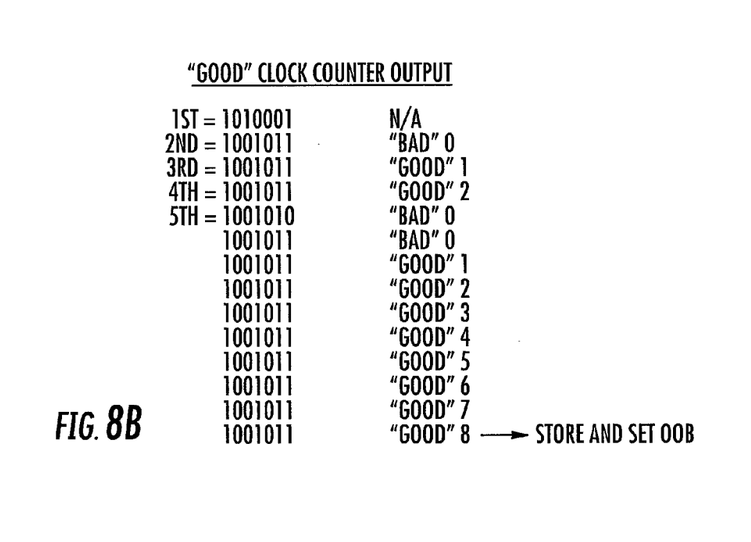
FIG. 8B is a table showing exemplary counter outputs generated by a series of external clocks.

FIG. 8A is an alternate circuit 400 for detecting when a predetermined series of stable external clock pulses have been detected. As seen in FIG. 8A, a plurality of pulses are generated by a fixed frequency clock 406 during each normal period of the external clock. These pulses are counted in counter 410 and the counter value fed to a first register 420. Each time an external clock pulse is received, it resets counter 410. As a result, the pulses generated during the next external clock period are then counted in counter 410 and this count is fed to first register 420 while the counter value in first register 420 is fed to a second register 430. This process repeats for each received external clock pulse. The counts stored in registers 420 and 430 are compared in a comparator 440 and the output fed to another counter 450 via an inverter 444. If the counts match, the counter 450 is incremented by one. If they do not match, counter 450 is reset to zero. If counter 450 reaches a predetermined value, e.g., 8, this indicates the external clock is stable and the counter 450 outputs the external clock select signal is generated and the circuit 200 clock selector switch 220 is set accordingly. FIG. 8B is a table that shows exemplary counter 410 outputs for a series of external clocks.

Figure 9:
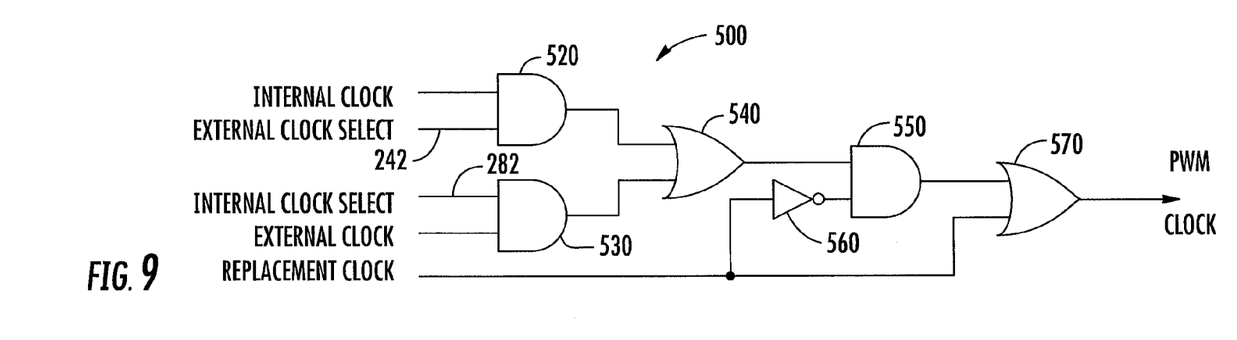
FIG. 9 is a schematic diagram of an exemplary clock selector circuit.

FIG. 9 is a schematic diagram of an exemplary clock selector switch 500 for use in the synchronization circuit 200 shown in FIG. 3. As is seen in FIG. 9, the external clock select signal 242 is connected to one input of an AND gate 520. The other input of AND gate 520 is connected to the internal clock. The internal clock select signal 282 is connected to one input 530 and the other input of AND gate 530 is connected to the external clock. These AND gates feed an OR gate 540. This logic circuit enables either the internal clock or the external clock to be fed to AND gate 550 as a function of the states of the internal and external clock select signals. AND gate 550 functions to block both the internal and external clock pulses when a replacement clock pulse has been generated by circuit 270 via an inverter 560. OR gate 570 couples either the replacement clock, the interior clock, or the external clock to the power supply as the PWM clock.

Figure 10:
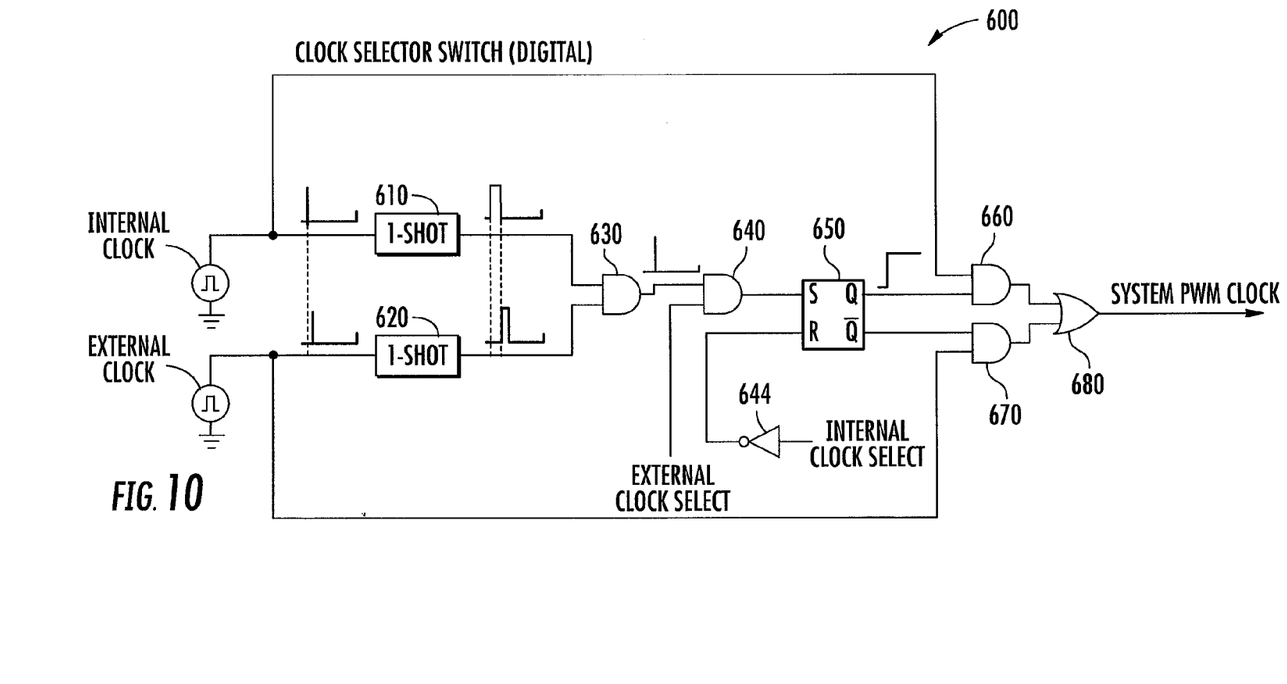
FIG. 10 is a schematic diagram of an alternate clock selector circuit.

FIG. 10 is a schematic diagram of an alternate clock selector switch 600 for use in the synchronization circuit 200 shown in FIG. 3. Circuit 600 ensures that there is a smooth transition from the internal to the external clock as described with respect to state 110 in FIG. 2. As seen in FIG. 10, circuit 600 includes two one-shots, one-shot 610 and one-shot 620. First one-shot 610 is driven by the internal clock and the second one-shot 620 is driven by the external clock. These one shots detect when the rising edges of the internal and external clocks occur. A logic circuit comprising first and second AND gates 630 and 640 is fed by the respective outputs of one-shots 610 and 620, along with the external clock select signal. The first and second one-shots 610 and 620 are timed so that an output sync signal is generated by AND gate 630 only when the rising edges of each clock pulse are within a predetermined pulse width of each other. AND gate 640 ensures that set-reset flip-flop 650 only sets when the external clock select signal has been generated, indicating that the external clock is currently stable. As a result, circuit 600 switches from the internal clock to the external clock, for output as the PWM clock, only after the external clock select signal is generated. Flip-flop 650 is reset by the generation of the internal clock select signal via an inverter 644.

In other words, when the two edges of one-shots 610 and 620 are near one another by an amount deemed small enough to minimize output voltage excursion and large enough to ensure switchover to the external clock in a timely manner, the circuit 600 will set latch 650 and thereafter block the internal clock, via an AND gate 660, while allowing the external clock to be output via AND gate 670 and OR gate 680. The above described circuit 600 operations are captured in the simulation waveforms of FIG. 7.

Embodiments of the present invention enable the internal clock to take over control of the power supply quickly and as close to the external clock as possible. Furthermore, the embodiments provide a smooth transition from the internal clock to an external clock and back with minimal power supply output voltage disturbance.

It should be kept in mind that, although the above-described embodiments use digital circuits for the described components of the present invention, it is equally clear to persons of ordinary skill in the art that analog components can be substituted for each of the described digital components. Consequently, the present application is not to be limited to just a digital implementation of the claimed elements.

Embodiments of the present invention have been described in relation to particular examples, which are intended in all respects to be illustrative rather than restrictive. Those skilled in the art will appreciate that many different combinations of circuits will be suitable for practicing the present invention. Moreover, other implementations of the invention will be apparent to those skilled in the art from consideration of the specification and practice of the invention disclosed herein. It is intended that the specification and examples therein be considered as exemplary only, with a true scope of the invention being indicated by the following claims.

What is claimed is:

1. A method for switching the clock controlling a switch mode power supply between an internal clock and an external clock, the method comprising:
   (a) determining when a predetermined plurality of external clock pulses of substantially equal switching period have been sequentially detected and generating an external clock select signal in response;
   (b) causing the operation of the power supply to be switched over to said external clock when the external clock select signal is generated;

(c) monitoring said external clock when it is controlling the operation of the power supply to determine if its switching period exceeds a predetermined dropout threshold;

(d) generating a replacement clock pulse for operating said power supply whenever the external clock switching period exceeds said dropout threshold;

(e) counting the number of replacement clock pulses generated sequentially and generating a reset signal when the count reaches a predetermined number;

(f) causing the operation of the power supply to be switched back to said internal clock in response to said reset signal; and (g) repeating of (a) to (f).

2. The method of claim 1, wherein said causing the operation to be switched over to said external clock comprises:

detecting when the rising edges of the internal and external clocks occur within a predetermined duration of time of each other; and switching over the operation of the power supply to said external clock in response to said detecting.

3. The method of claim 1, wherein said reset signal further causes the internal clock to be reset.

4. The method of claim 1, wherein determining when a predetermined plurality of external clock pulses of substantially equal switching period have been sequentially detected comprises:

measuring the switching period of each external clock pulse;

storing the switching period in a memory for one external clock period;

comparing the switching period of the current external clock pulse to the stored switching period and generating a match signal when the two switching periods are substantially equal;

incrementing an up counter each time the match signal is generated and resetting said up counter whenever the two switching periods are not substantially equal; and generating said external clock select signal in response to the up counter reaching a predetermined count.

5. The method of claim 1, wherein determining when a predetermined plurality of external clock pulses of substantially equal switching period has been sequentially detected comprises:

counting the number of pulses generated by a fixed clock generated during each period of said external clock;

storing each count in a first register;

storing in a second register the count in the first register at the end of the next external clock period;

comparing the counts in the first and second registers;

counting each time the counts in the first and second registers are equal and restarting the count at zero when said counts are unequal; and generating an external clock select signal when said count equals the number corresponding to said predetermined plurality of external clock pulses.

6. The method of claim 1, wherein monitoring said external clock when it is controlling the operation of the power supply to determine if its switching period exceeds a predetermined dropout threshold comprises:

generating a saw-tooth signal whose amplitude rises as a function of the duration of the period of a current external clock;

saving the peak of this signal as a clock to period conversion signal until the end of the period of the next external clock pulse;

increasing the amplitude of said clock to period conversion signal by an amount that is a function of said predetermined dropout threshold; and comparing the increased amplitude clock to period conversion signal with the amplitude of the saw-tooth signal of said next external clock pulse to determine if the switching period of said next external clock pulse exceeds said dropout threshold.

7. The method of claim 1, wherein the frequency of the internal clock is set to be the same as the frequency of said external clock.

8. A synchronization circuit for switching between an internal clock and an external clock for operating a switch mode power supply, the synchronization circuit comprising:

an internal oscillator for generating an internal clock;

a clock selector switch for switching between said external clock, said internal clock, and a replacement clock for operation of said power supply, said switch enabling said internal clock to operate said power supply when an internal clock select signal is generated and enabling said external clock to operate said power supply when an external clock select signal is generated at all times except when a replacement clock pulse is generated;

a first circuit to detect when a stable external clock exists and for causing said external clock select signal to be generated in response to said detection;

a second circuit to detect when an external clock pulse has a period that is longer than the period of the previous external clock pulse by a predetermined dropout threshold and for generating a replacement clock pulse in response; and a first counter for counting the number of replacement clock pulses sequentially generated by said second circuit and for causing said internal clock select signal to be generated when a predetermined count has been reached by said first counter, said first counter being reset by any external clock pulse whose period does not cause the generation of a replacement clock pulse.

9. The circuit of claim 8, wherein said clock selector switch includes a first one-shot driven by said internal clock; a second one-shot driven by said external clock; and a logic circuit, said first and second one-shots timed so that an output sync signal is generated only when the rising edges of each clock pulse are within a predetermined pulse width of each other, said logic circuit for causing said clock selector switch to switch to said external clock when said output sync signal is generated.

10. The circuit of claim 9, wherein said logic circuit causes said clock selector switch to switch back to said internal clock when said internal clock select signal is generated.

11. The circuit of claim 8, wherein said internal clock select signal further resets said internal clock.

12. The circuit of claim 8, wherein said first circuit to detect when a stable external clock exists and for generating said external clock select signal in response comprises:

a measurement circuit for measuring the period of each external clock;

a memory for storing each successive measured external clock period;

a comparator for comparing the period of the current external clock to the clock period stored in said memory;

a second counter that is incremented each time the period of the current external clock matches the clock period stored in said memory and that is reset to zero when the two clock periods do not match; and a third circuit for generating said external clock select signal when the count in said second counter reaches a predetermined number.

13. The circuit of claim 8, wherein said first circuit to detect when a stable external clock exists and for generating said external clock select signal in response comprises:
a fixed clock for generating pulses having a predetermined frequency higher than the frequency of said external clock;
a second counter for counting the number of pulses of said fixed clock that occur during the period of each external clock;
a first register for storing the count from said second counter for each external clock period;
a second register for storing the count stored in said first register at the end of the next external clock period;
a comparator for comparing the counts stored in said first and second registers;
a third counter for counting each time the counts compared by said comparator are equal, said third counter reset to zero when said counts are unequal; and
a third circuit for generating said external clock select signal when the count in said second counter reaches a predetermined number.

14. The circuit of claim 8, wherein said second circuit to detect when an external clock pulse has a period that is longer than the period of the previous external clock pulse by a predetermined dropout threshold and for generating a replacement clock pulse in response comprises:
a saw tooth generator circuit for generating a saw tooth signal that ramps up in value during the duration of each external clock pulse;
a clock to period conversion circuit for sampling and holding the peak value of said saw tooth signal at the end of each clock pulse;
a multiplier for multiplying said peak value by a predetermined amount corresponding to a drop out threshold for said external clock;
a comparator for comparing the multiplied peak value with the peak value generated by said saw tooth generator circuit at the end of the duration of the next external clock pulse and for generating an out of bounds signal when the peak value generated of the saw tooth generator is higher than the multiplied peak value; and
a clock pulse replacement circuit for generating said clock replacement pulse whenever said out of bounds signal is generated.

15. The circuit of claim 14, wherein said saw tooth generator circuit comprises a current source;
a capacitor connected between said current source and ground;
a switch connected across said capacitor; and
an edge detect circuit for detecting the rising edge of each external clock pulse and for generating a signal to cause said switch to briefly close and thereby discharge said capacitor, to thereby enable the voltage across said capacitor to ramp up during the duration of each said external clock pulse.

16. The circuit of claim 15, wherein said saw tooth generator circuit further comprises an OR gate coupled to said edge detect circuit, one input of said OR gate for receiving said external clock pulse and the other input of said OR gate for receiving said replacement clock pulse.

17. A power supply, comprising:
a voltage converter;
a pulse width modulation control circuit for controlling the operation of said voltage converter;
an internal oscillator for generating an internal clock;
a clock selector switch for outputting a PWM clock to said pulse width modulation control circuit;
a first circuit for detecting when an external clock is generating pulses of a predetermined stability, said clock selector switch acting in response to said detection to output the external clock as said PWM clock;
a second circuit to detect when a pulse generated by said external clock has a period that is longer than the period of the previous external clock pulse by a predetermined dropout threshold and for causing a replacement clock pulse to be generated, said clock selector switch acting in response to output the replacement clock pulse as said PWM clock; and
a counter for determining when a predetermined number of replacement clock pulses have been sequentially generated, said clock selector switch acting in response to said determining to output the internal clock as said PWM clock.

18. A power system comprising:
a plurality of power supply modules whose outputs are coupled in parallel for connection to a load; and
an external clock coupled to each said power supply module;
wherein each said power supply module comprises:
a first circuit for detecting when the external clock is generating pulses of a predetermined stability and for causing an external clock select signal to be generated in response to said detection;
a second circuit to detect when an external clock pulse has a period that is longer than the period of the previous external clock pulse by a predetermined dropout threshold and for causing a replacement clock pulse to be generated in response; and
a counter for causing an internal clock select signal to be generated when a predetermined number of replacement clock pulses have been sequentially generated.

* * * * *